(12) United States Patent
Kim

(10) Patent No.: US 7,782,663 B2
(45) Date of Patent: Aug. 24, 2010

(54) DATA STORAGE DEVICE USING MAGNETIC DOMAIN WALL MOVEMENT AND METHOD OF OPERATING THE DATA STORAGE DEVICE

(75) Inventor: Yong-su Kim, Yongin-si (KR)

(73) Assignee: Samsung Electronics Co., Ltd., Suwon-Si Gyeonggi-do (KR)

(*) Notice: Subject to any disclaimer, the term of this patent is extended or adjusted under 35 U.S.C. 154(b) by 151 days.

(21) Appl. No.: 11/730,469

(22) Filed: Apr. 2, 2007

(65) Prior Publication Data
US 2008/0080092 A1 Apr. 3, 2008

(30) Foreign Application Priority Data
Sep. 29, 2006 (KR) .................. 10-2006-0096395

(51) Int. Cl.
*G11C 11/14* (2006.01)
(52) U.S. Cl. .................. 365/171; 365/148; 365/158; 365/173; 365/225.5; 365/243.5; 977/933; 977/935
(58) Field of Classification Search ............... 257/421, 257/E21.665; 438/3; 977/933–935; 365/141, 365/171–173, 158, 48, 55, 62, 66, 74, 78, 365/80–93, 100, 130, 131, 148, 225.5, 243.5; 216/22
See application file for complete search history.

(56) References Cited

U.S. PATENT DOCUMENTS 3,369,225 A * 2/1968 Fuller ........................ 365/87
6,631,055 B2 * 10/2003 Childress et al. ............ 360/321

2005/0094427 A1 * 5/2005 Parkin ....................... 365/80

(Continued)

FOREIGN PATENT DOCUMENTS

EP 1 826 771 A 8/2007

(Continued)

OTHER PUBLICATIONS

Spin Angular Momentum Transfer in Current-Perpendicular Nanomagnetic Junctions, Sun, IBM Journal of Research and Development, vol. 50, No. 1, Jan. 15, 2006, pp. 81-100.*

(Continued)

*Primary Examiner*—Richard Elms
*Assistant Examiner*—Harry W Byrne
(74) *Attorney, Agent, or Firm*—Harness, Dickey & Pierce, P.L.C.

(57) ABSTRACT

A data storage device includes a magnetic layer having a plurality of magnetic domains, a write head provided at an end portion of the magnetic layer, a read head to read data written to the magnetic layer, and a current controller connected to the write head and the read head. A method of operating the data storage device includes reading data of an end portion of the magnetic layer using a read head provided at the end portion of the magnetic layer in which a write head is provided at the other end portion thereof, moving a magnetic domain wall of the magnetic layer by a distance corresponding to the length of one magnetic domain toward the end portion, and writing the read data to the other end portion of the magnetic layer using the write head and a current controller provided between the write head and the read head.

22 Claims, 8 Drawing Sheets

< SECOND OPERATION >

U.S. PATENT DOCUMENTS

| | | | |
|---|---|---|---|
| 2005/0226043 A1* | 10/2005 | Parkin et al. | ................. 365/173 |
| 2006/0120132 A1 | 6/2006 | Parkin | |
| 2006/0238191 A1 | 10/2006 | Saito | |
| 2008/0080234 A1* | 4/2008 | Iwata et al. | ................. 365/171 |

FOREIGN PATENT DOCUMENTS

| | | |
|---|---|---|
| GB | 1 090 921 A | 11/1967 |
| GB | 2 207 312 A | 1/1989 |
| JP | 2006-5308 A | 1/2006 |

OTHER PUBLICATIONS

Current-Induced Domain-Wall Switching in a Ferromagnetic Semiconductor Structure, Yamanouchi, et al., Nature, vol. 428, Apr. 2004, pp. 539-542.*

European Search Report (dated Jun. 11, 2008) for counterpart European Patent Application No. 07150252.0 is provided for the purposes of certification under 37 C.F.R. § 1.97(e).

* cited by examiner

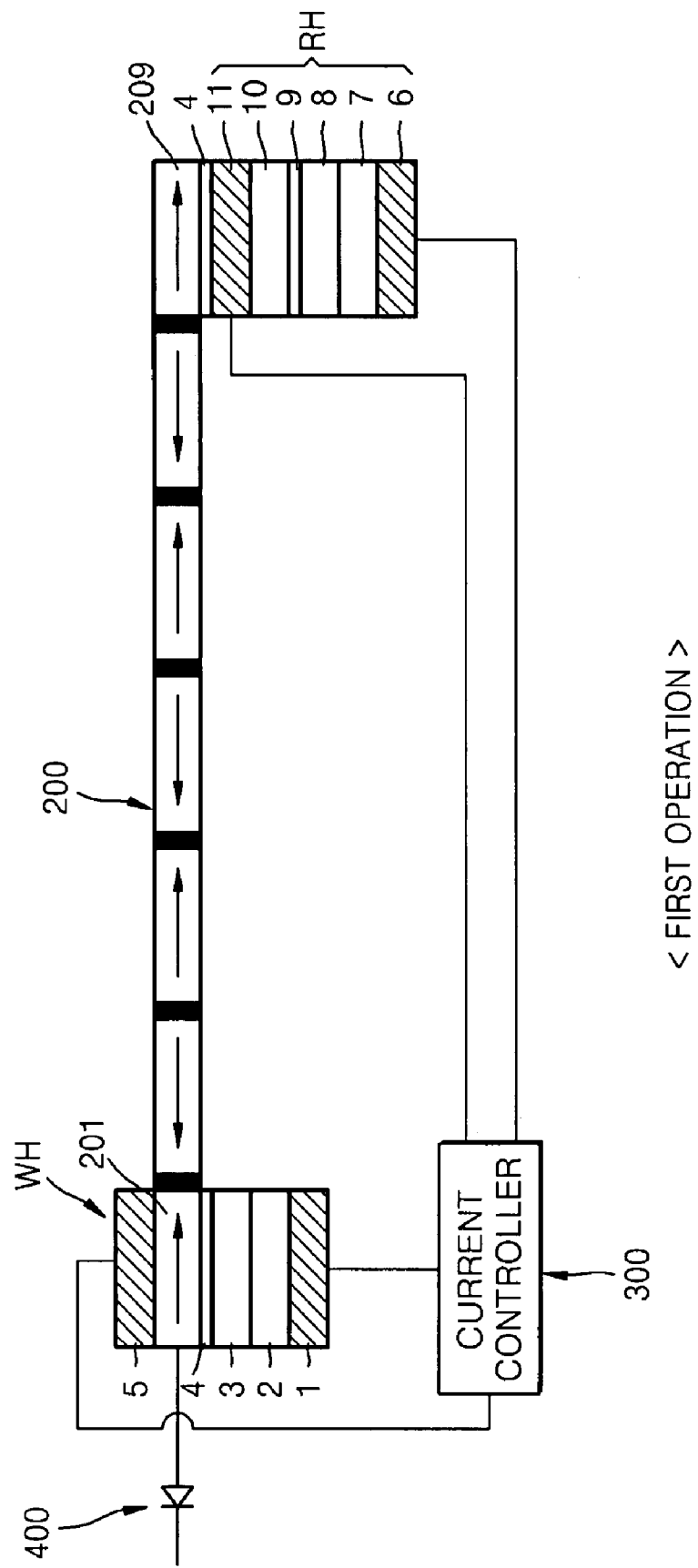

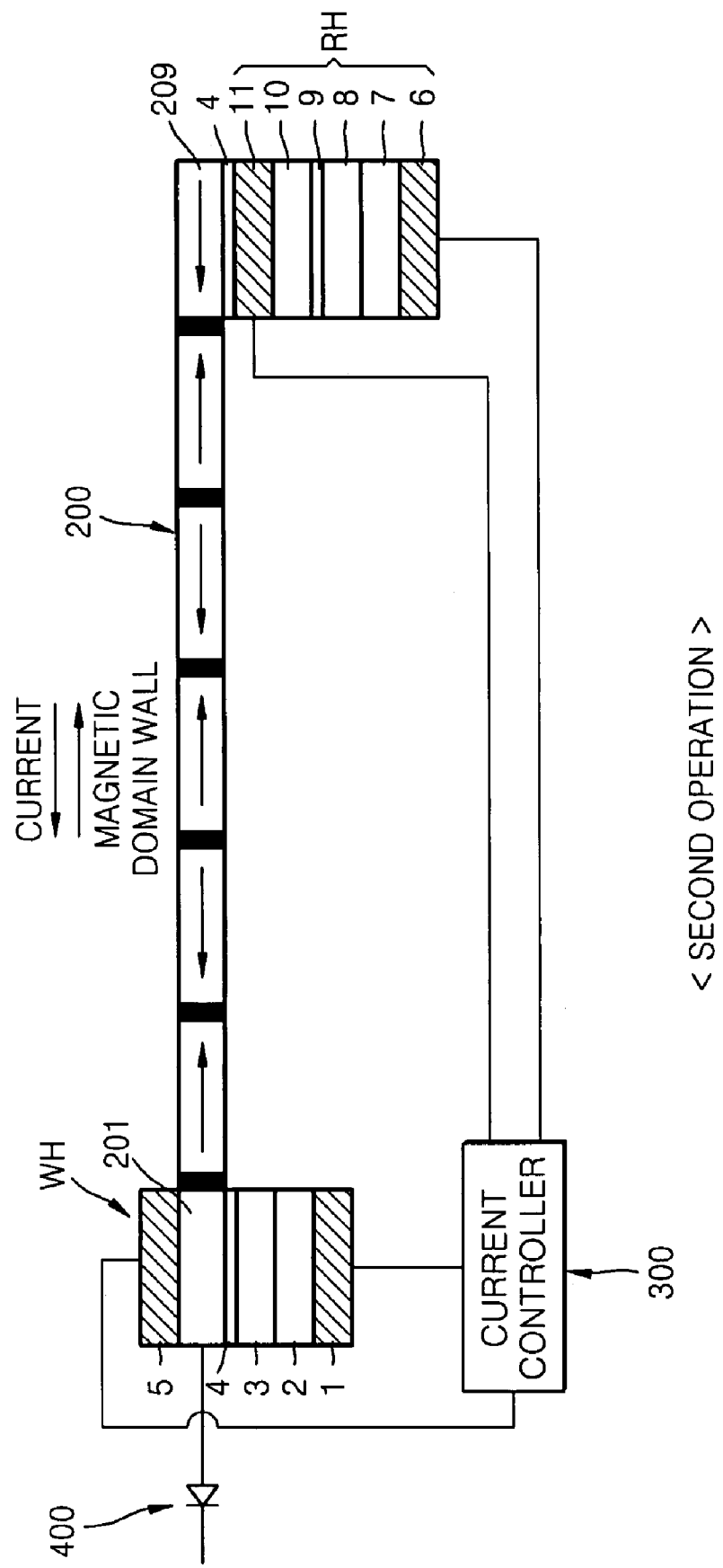

< THIRD OPERATION >

< FIRST OPERATION >

DATA STORAGE DEVICE USING MAGNETIC DOMAIN WALL MOVEMENT AND METHOD OF OPERATING THE DATA STORAGE DEVICE

CROSS-REFERENCE TO RELATED PATENT APPLICATIONS

This application claims priority from Korean Patent Application No. 10-2006-0096395, filed on Sep. 29, 2006, in the Korean Intellectual Property Office, the disclosure of which is incorporated herein in its entirety by reference.

BACKGROUND OF THE INVENTION

1. Field of the Invention

Apparatuses and methods consistent with the present invention relate to a data storage device and a method of operating the data storage device, and more particularly, to a data storage device using magnetic domain wall movement of a magnetic material and a method of operating the data storage device.

2. Description of the Related Art

A magnetic minute area included in a ferromagnetic body is referred to as a magnetic domain. The direction of a magnetic moment is identical in the magnetic domain. The size and magnetization direction of the magnetic domain can be appropriately controlled by the properties, shape and size of the magnetic material and an external energy applied to the magnetic material.

A magnetic domain wall is a boundary area between magnetic domains having different magnetization directions and has a predetermined volume. The magnetic domain wall can be moved by a magnetic field or current applied to the magnetic material. That is, a plurality of magnetic domains having particular magnetization directions can be formed in a magnetic layer having predetermined width and thickness and the magnetic domains can be moved using a magnetic field or current having an appropriate strength.

A magnetic domain wall movement principle can be applied to a data storage device. When the magnetic domain wall movement principle is applied to a data storage device, since the magnetic domain wall movement allows the magnetic domains to pass by a read/write head, read/write operations are possible without rotation or any physical movement of a recording medium. An example of the data storage device in which the magnetic domain wall movement principle is applied has been introduced by U.S. Pat. No. 6,834,005 B1.

FIG. 1 is a perspective view of a conventional data storage device using the magnetic domain wall movement principle which was introduced in U.S. Pat. No. 6,834,005 B1. Referring to FIG. 1, the conventional data storage device using the magnetic domain wall movement principle (hereinafter, referred to as "conventional storage device") includes a U-shaped magnetic layer 100. The magnetic layer 100 includes a storage area S formed of a plurality of magnetic domains that are arranged one after the other and a buffer area B having a length similar to that of the storage area S. In FIG. 1, the buffer area B is the right column part of the magnetic layer 100, but the position thereof may vary. A read head RH and a write head WH are provided under the middle portion of the magnetic layer 100.

Although it is not illustrated, the magnetic layer 100 is connected to a transistor used as a driving device. The direction of current applied to the magnetic layer 100 is controlled by the transistor. The direction of the magnetic domain wall movement is determined according to the direction of the current. The read/write operation is performed by pushing and pulling the magnetic domain walls by controlling the direction of the current.

However, the above-described conventional storage device has the following disadvantages.

First, since the conventional storage device, which performs the read/write operation by pushing and pulling the magnetic domain walls, requires the buffer area B to be as large as the storage area S, an effective storage capacity is only ½ of a physical storage capacity.

Second, when a read operation is performed by pushing the magnetic domain walls toward the buffer area B, for a next read operation, the magnetic domains of the buffer area B are pulled back toward the storage area S to return the position of the magnetic domains to their original state. Accordingly, power consumption increases and the read and write speed of data decreases.

Third, since the operation of pushing and pulling the magnetic domain walls is repeated, the characteristic of the magnetic domain wall is deteriorated and the life span of the storage device is shortened.

Fourth, since the U-shaped magnetic layer 100 is difficult to manufacture using present etching techniques, it is difficult to produce the conventional storage device. Furthermore, a plurality of notches need to be formed at regular intervals on the surface of the magnetic layer 100 to secure the stability of the magnetic domain wall movement. However, it is very difficult to uniformly form the fine notches on the U-shaped magnetic layer 100.

Therefore, the problems of the conventional storage device stem from the pushing and pulling of the magnetic domain walls and the U shape of the magnetic layer 100.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above. Accordingly, the present invention provides a data storage device using magnetic domain wall movement having a structure and an operational mode that may improve the effective storage capacity, power consumption, operational speed, life span, and realization thereof.

The present invention also provides a method of operating the above data storage device.

According to an aspect of the present invention, a data storage device using a magnetic domain wall movement comprises a magnetic layer having a plurality of magnetic domains, a write head provided at an end portion of the magnetic layer, a read head to read data written to the magnetic layer, and a current controller connected to the write head and the read head.

The read head may be provided at an other end portion of the magnetic layer.

The read head may be provided at a portion of the magnetic layer adjacent to the write head.

The write head may be a structure in which a first electrode, an anti-ferromagnetic layer, a ferromagnetic layer, a separation layer, the end portion of the magnetic layer, and a second electrode are sequentially deposited.

The data storage device may further comprise a separation layer between the magnetic layer and the write head.

The separation layer may comprise a conductive layer.

The read head may be a structure in which a first electrode, an anti-ferromagnetic layer, a first ferromagnetic layer, a separation layer, a second ferromagnetic layer, and a second electrode are sequentially deposited.

The data storage device may comprise a separation layer between the magnetic head and the read head.

The separation layer of the data storage device may comprise an insulation layer or a conductive layer.

An electric resistance of the conductive layer may be 10-100 times greater than that of the magnetic layer.

The data storage device may further comprise a driving device connected to the magnetic layer and which supplies energy which moves a wall between adjacent ones of the plurality of magnetic domains. The driving device may be a diode.

The magnetic layer may be a linear type Layer.

A plurality of notches may be formed on a surface of the magnetic layer.

The data storage device may further comprise a diode as a driving device that is connected to the magnetic layer and which supplies energy which moves a wall between adjacent ones of the plurality of magnetic domains.

The write head and the read head each may be provided to correspond to respective bit areas closed to each other.

The data storage device may further comprise a stack memory connected to the read head and the current controller. The data storage device may further comprise a data controller connected to the stack memory. The write head and the read head may be a giant magneto resistance (GMR) head or a tunnel magneto resistance (TMR) head.

According to another aspect of the present invention, a method of operating a data storage device comprises reading data of an end portion of the magnetic layer using a read head provided at the end portion of the magnetic layer in which a write head is provided at the other end portion thereof, moving magnetic domain walls of the magnetic layer by a distance corresponding to the length of one magnetic domain toward an end portion, and writing the read data to the other end portion of the magnetic layer using the write head and a current controller connected to the write head and the read head.

The reading of data of the end portion of the magnetic layer, moving a magnetic domain wall of the magnetic layer by one bit toward the other end portion, and writing the read data to the end portion of the magnetic layer may be sequentially repeated until the entire data written to the magnetic layer is circulated once.

In the reading of data of the end portion of the magnetic layer, current may be applied to the read head.

In the moving of a magnetic domain wall of the magnetic layer by one bit toward the other end portion, a diode connected to the magnetic layer so as to move a magnetic domain wall may be used. A pulse current may be applied to the magnetic layer through the diode.

According to another aspect of the present invention, a method of operating a data storage device comprises reading data written to a magnetic layer using a read head provided at the magnetic layer by moving a magnetic domain wall of the magnetic layer by one bit toward an end portion of the magnetic layer and storing the data read from the magnetic layer in a stack memory connected to the read head, and writing the data stored in the stack memory to the magnetic layer using a write head provided at the end portion of the magnetic layer and a current controller connected to the write head and the stack memory by moving the magnetic domain wall of the magnetic layer by one bit toward an other end portion of the magnetic layer.

The read head may be provided at a portion of the magnetic layer adjacent to the write head.

BRIEF DESCRIPTION OF THE DRAWINGS

The above and other features and aspects of the present invention will become more apparent by describing in detail exemplary embodiments thereof with reference to the attached drawings in which:

FIGS. 3A through 3C are cross-sectional views for explaining a read operation of the data storage device of FIG. 2, according to an exemplary embodiment of the present invention;

DETAILED DESCRIPTION OF THE EXEMPLARY EMBODIMENTS OF THE PRESENT INVENTION

Figure 1:
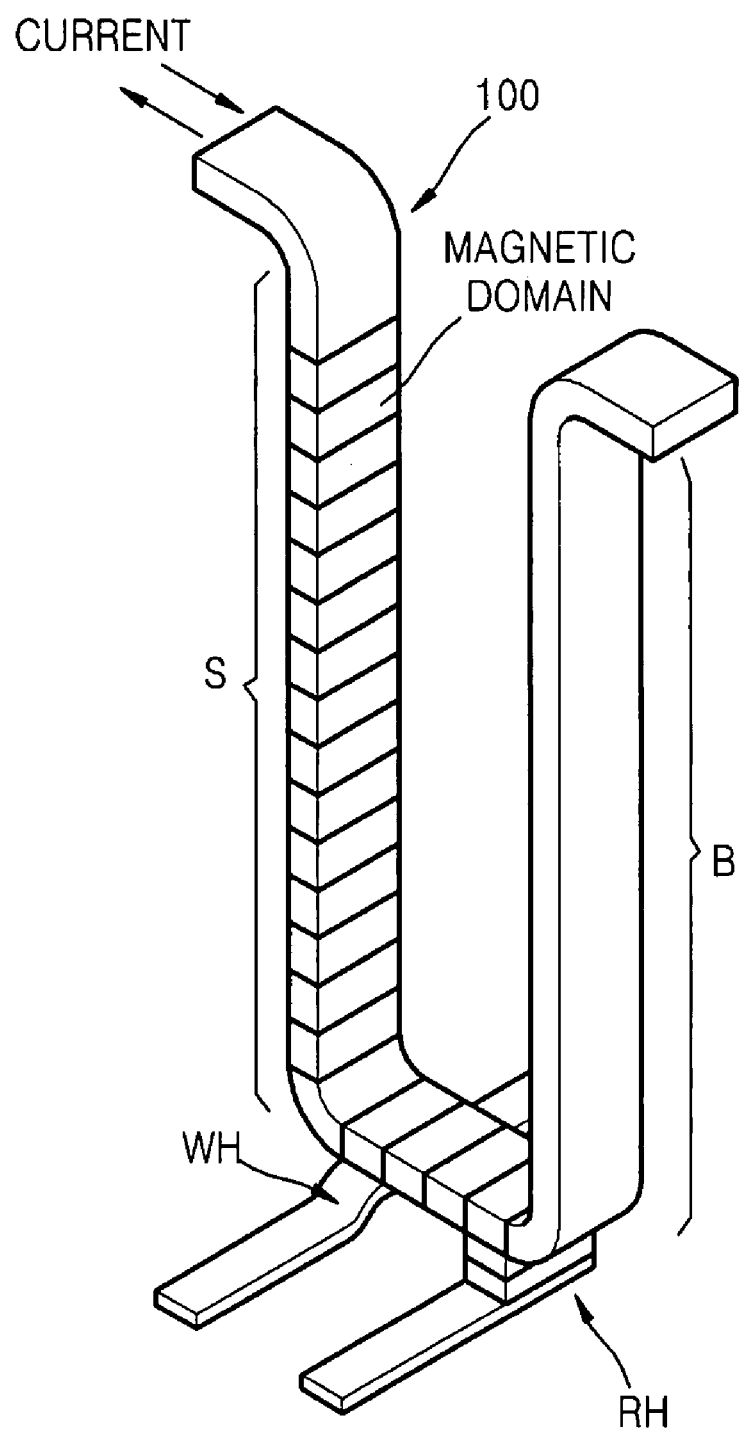
FIG. 1 is a perspective view of a conventional data storage device using the magnetic domain wall movement principle which is introduced in U.S. Pat. No. 6,834,005 B1.

The present invention will now be described more fully with reference to the accompanying drawings, in which exemplary embodiments of the invention are shown. The thicknesses of the layers and regions illustrated in the drawings are exaggerated for clarity.

Figure 2:
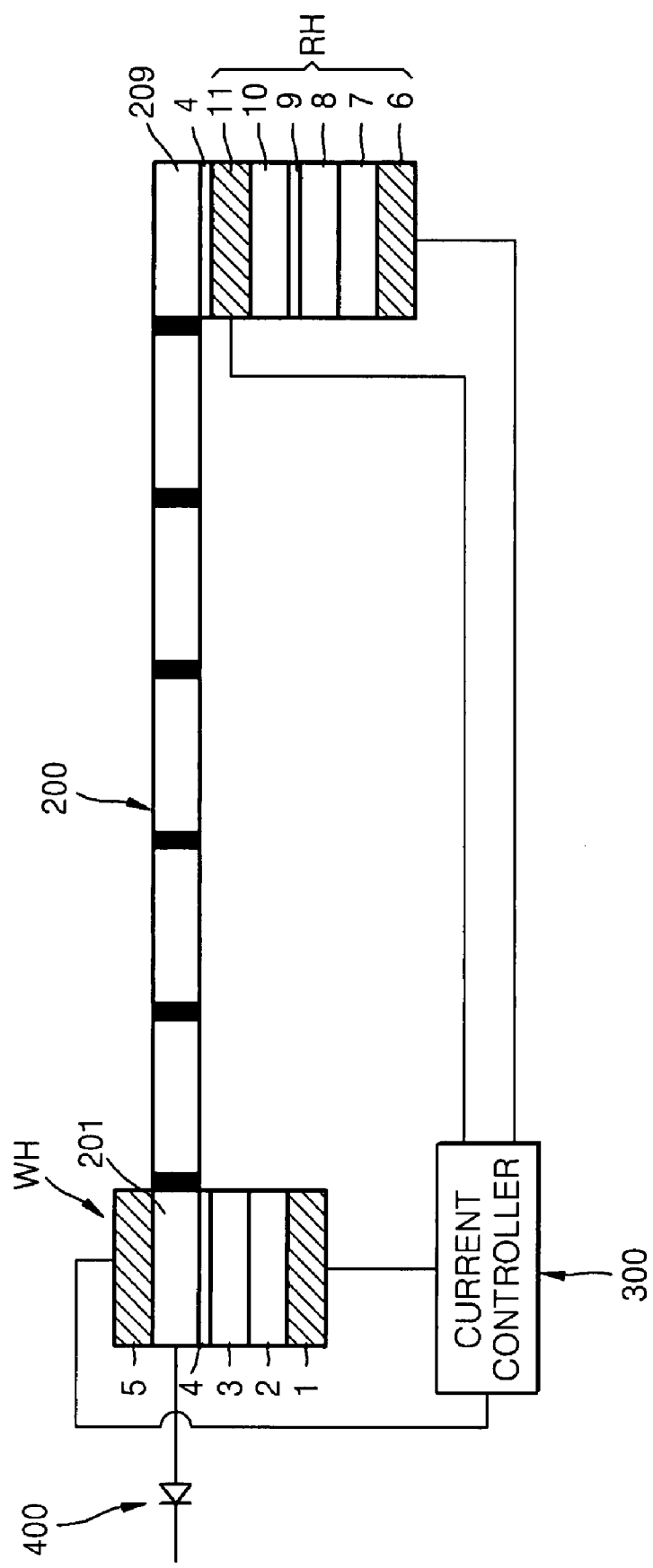
FIG. 2 is a schematic cross-sectional view of a data storage device using a magnetic domain wall movement according to an exemplary embodiment of the present invention.

FIG. 2 is a cross-sectional view of a data storage device using magnetic domain wall movement according to an exemplary embodiment of the present invention. Referring to FIG. 2, a data storage device according to the present embodiment (hereinafter, referred to as "first data storage device") includes a magnetic layer 200 having a plurality of magnetic domains. In FIG. 2, black portions in the magnetic layer 200 are magnetic domain walls that are boundaries between magnetic domains. The magnetic layer 200 may be of a linear type and notches may be formed on the surface of the magnetic layer 200 to improve stability of the magnetic domain wall movement. The notches may be formed to define magnetic domain areas. The entire area of the magnetic layer 200 may be employed as a storage area, as is described later. That is, the magnetic layer 200 may have no buffer area.

A write head (WH) is provided at an end portion 201 of the magnetic layer 200 and a read head (RH) may be provided at the other end portion 209 thereof. The WH and RH may each be a head using a giant magneto-resistance (GMR) effect or a tunnel magneto-resistance (TMR) effect.

In detail, the WH may be a structure in which a first electrode 1, a first anti-ferromagnetic layer 2, a first ferromagnetic layer 3, a first separation layer 4, the end portion 201 of the magnetic layer 200, and a second electrode 5 are sequentially deposited. When the first separation layer 4 is an insulation layer, the WH is a TMR head and when the first separation layer 4 is a conductive layer the WH head is a GMR head.

The first ferromagnetic layer 3 is a pinned layer in which the magnetization direction thereof is fixed by the first anti-ferromagnetic layer 2. The end portion 201 of the magnetic layer 200 is a free layer in which the magnetization direction is variable. The magnetization direction of the end portion 201 of the magnetic layer 200 is determined according to a voltage difference between the first electrode 1 and the second electrode 5.

When the first separation layer 4 is a conductive layer, the electric resistance of the first separation layer 4 may be greater than that of the magnetic layer 200. Thus, current leakage through the first separation layer 4 may be prevented. For the same reason, a conductive layer having a resistance greater than that of the magnetic layer 200 may be provided between the end portion 201 of the magnetic layer 200 and the second electrode 5. The electric resistance of the conductive layers may be 10 to 100 times greater than that of the magnetic layer 200.

The RH may be arranged at the other end portion 209 of the magnetic layer 200 and may be a structure in which a third electrode 6, a second anti-ferromagnetic layer 7, a second ferromagnetic layer (fixed layer) 8, a second separation layer 9, a third ferromagnetic layer (free layer) 10, and a fourth electrode 11 are sequentially deposited. When the second separation layer 9 is an insulation layer, the RH is a TMR head and when the second separation layer 9 is a conductive layer the RH is a GMR head. The RH and the magnetic layer 200 can be separated a predetermined distance from each other. Another separation layer 4 that is the same as the first separation layer 4 may be provided between the magnetic layer 200 and the RH, that is, on the lower surface of the other end portion 209 of the magnetic layer 200. The separation layer 4 may be an insulation layer to reduce noise generated during a read operation. The separation layer 4 may be provided on the entire area of the lower surface of the magnetic layer 200.

During the read operation, the principle that resistance between the electrodes 6 and 11 of the RH changes according to the magnetization direction of the other end portion 209 of the magnetic layer 200 is employed.

A current controller 300 is provided between the WH and RH and connected therebetween. The current controller 300 passes information obtained from the RH to the WH. Thus, a difference in the electric potential between the electrodes 1 and 5 of the WH may be determined by the information obtained from the RH. In other words, the data read from the other end portion 209 of the magnetic layer 200 may be transferred to the end portion 201 of the magnetic layer 200.

Also, the first data storage device may further include a driving device 400 connected to the end portion 201 of the magnetic layer 200. The driving device 400 for supplying current to move a magnetic domain wall may be a diode. Since the magnetic domain wall is moved in the same direction as a direction in which electrons move, the direction of the magnetic domain wall movement is opposite to the direction of current flow. The magnetic domain wall movement may alternatively be realized by an external magnetic field, instead of a current.

A method of operating the first storage device described with reference to FIG. 2 is described below.

Read Operation

Figure 3C:
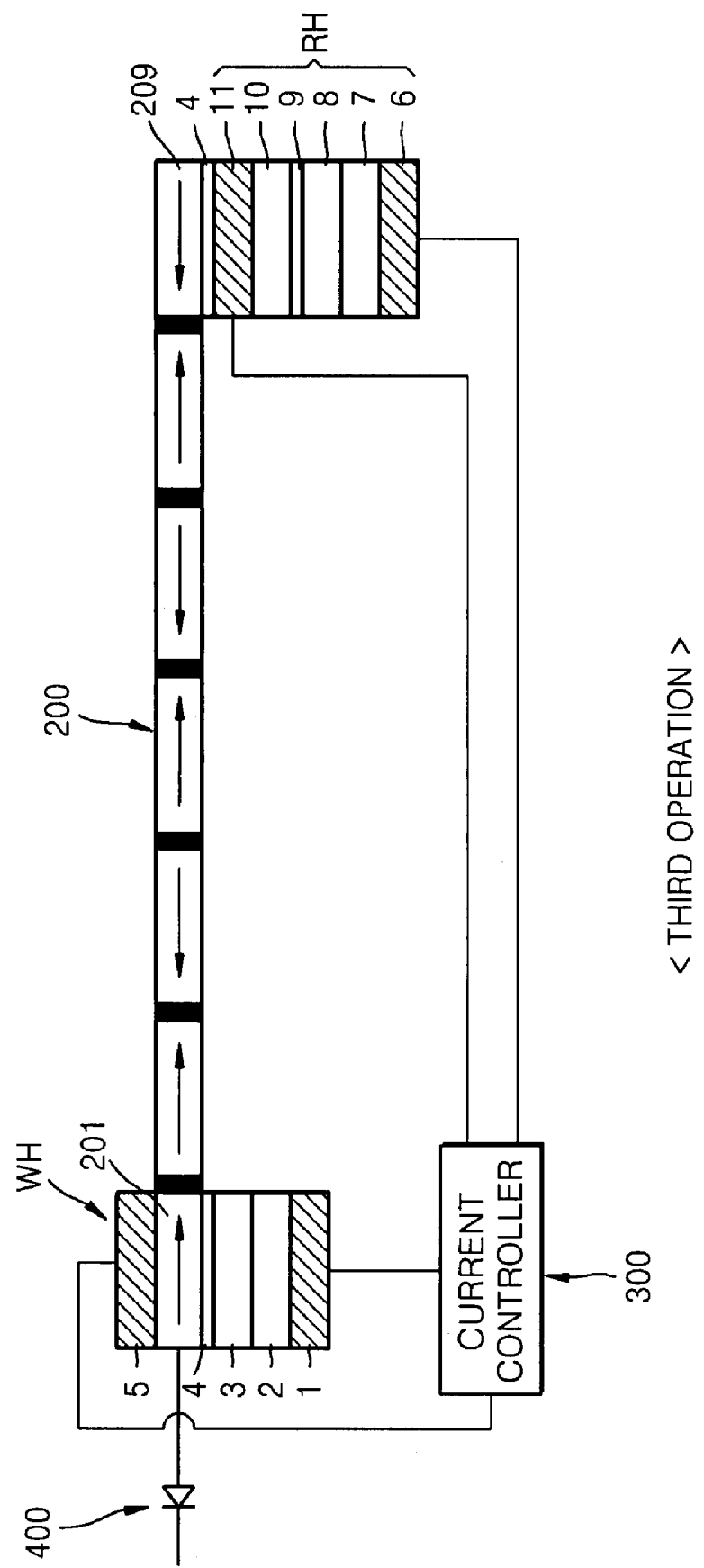

FIGS. 3A through 3C are views for explaining a read operation of the first data storage device. A method of operating the first data storage device includes reading information of the other end portion 209 of the magnetic layer 200 using the RH (operation 1), moving the magnetic domain walls of the magnetic layer 200 by one bit unit toward the other end portion 209 using the driving device 400 (operation 2), and writing the read information to the end portion 201 of the magnetic layer 200 using the current controller 300 and the WH (operation 3). FIGS. 3A, 3B, and 3C respectively correspond to operations 1, 2, and 3.

In operation 2, current is supplied in a direction from the other end portion 209 to the end portion 201 making the magnetic domain walls move in the opposite direction. In operation 3, the current controller 300 transmits the information read by the RH to the WH. The operations 1, 2, and 3 may be sequentially repeated.

In the method of operating the first data storage device the information read from the other end portion 209 of the magnetic layer 200 is transferred unchanged to the end portion 201 of the magnetic layer 200. In the transfer process, the magnetic domain wall is moved a distance corresponding to the length of one magnetic domain (one magnetic domain is one bit) toward the other end portion 209 of the magnetic layer 200. By repeating the magnetic domain wall movement and the transfer process, the read operation may be completed by moving the magnetic domain walls in a direction. The order of the bits of data after the read operation is the same as the order of the bits of the data before the read operation.

Although FIGS. 3A through 3C illustrate a case that the magnetic layer 200 has a horizontal magnetic anisotropy, the present invention may be identically applied to a case that the magnetic layer 200 has a perpendicular magnetic anisotropy.

Write Operation

An operation to write new data to the first data storage device includes writing new data to the end portion 201 of the magnetic layer 200 using the write head WH (operation 1') and moving the magnetic domain walls of the magnetic layer 200 by one bit toward the other end portion 209 using the driving device 400 (operation 2'). The operations 1' and 2' may be sequentially performed.

Figure 4:
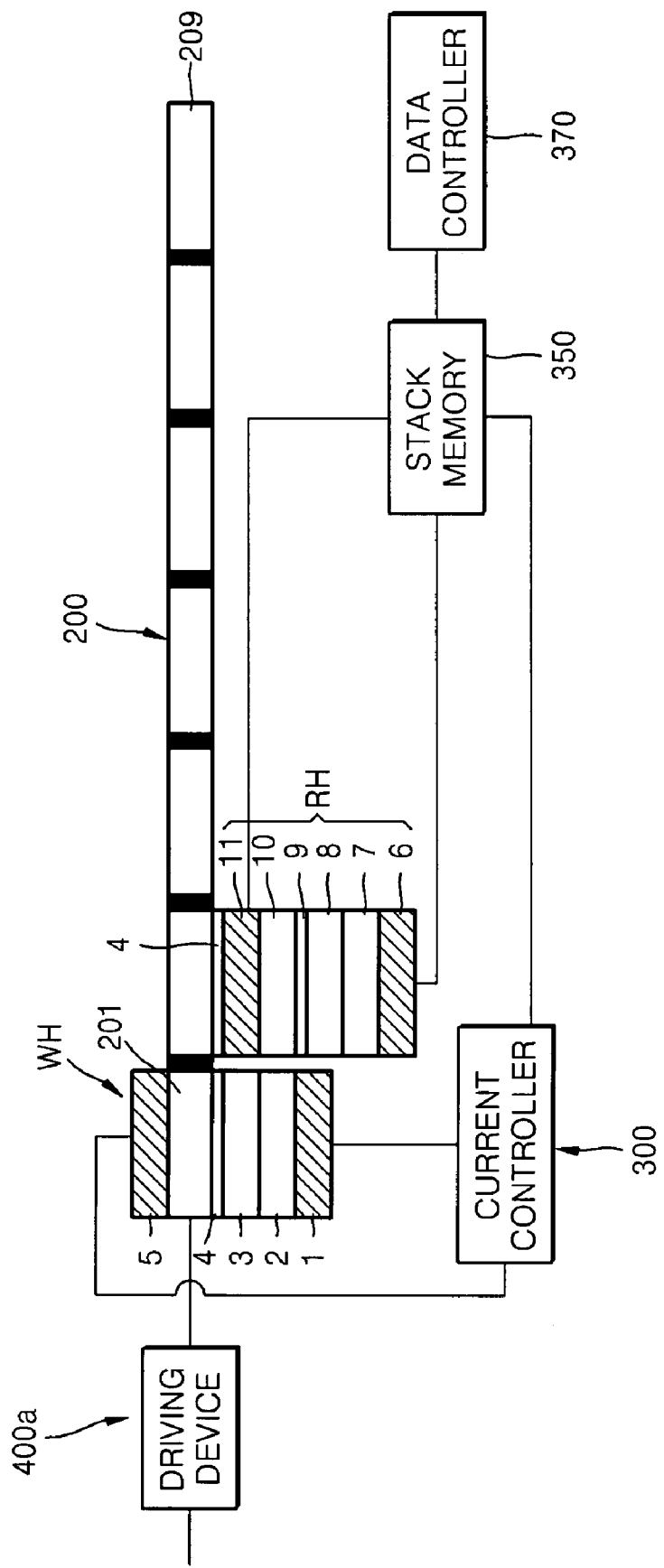
FIG. 4 is a schematic cross-sectional view of a data storage device using a magnetic domain wall movement according to another exemplary embodiment of the present invention.

FIG. 4 is a cross-sectional view of a data storage device using a magnetic domain wall movement according to another embodiment of the present invention. In FIGS. 2 and 4, the same reference numerals indicate the same elements. Referring to FIG. 4, a data storage device using magnetic domain wall movement according to another embodiment of the present invention (hereinafter, referred to as "second data storage device") is a modification of the first data storage device.

Essentially, the magnetic layer 200, the position and structure of the WH, the structure of the RH, the material of the first separation layer 4, and the current controller 300 in the second data storage device are the same as those of the first storage device. However, in the second data storage device the RH may be formed on the magnetic layer 200 close to the WH. That is, the RH and WH may be provided to respectively correspond to two magnetic domains close to the end portion 201 of the magnetic layer 200. A separation layer 4 formed of the same material as the first separation layer 4 may be provided between the read head RH and the magnetic layer 200.

In the second data storage device, a stack memory 350 capable of storing data may be provided between the RH and the current controller 300. A data controller 370 connected to the stack memory 350 may be further provided. The data controller 370 may change the order of data stored in the stack memory 350 or may store new data in the stack memory 350.

Also, a driving device 400a applying energy for the magnetic domain movement in the second data storage device is different from the first data storage device. In detail, the driving device 400 in the first data storage device may be a diode. The driving device 400 of FIG. 2 moves the magnetic domain wall in one direction only. However, the driving device 400a in the second data storage device may move the magnetic domain in either direction. For example, the driving device 400a may include first and second transistors and may be connected to one of either end of the magnetic layer 200. The direction of the current being applied is changed according to the on/off state of the first and second transistors. The driving device 400a may be variously modified, for example, the first and second transistors may be connected to both ends of the magnetic layer 200.

Referring to FIG. 4, a method of operating the second data storage device is described below.

Read Operation

Figure 5A:
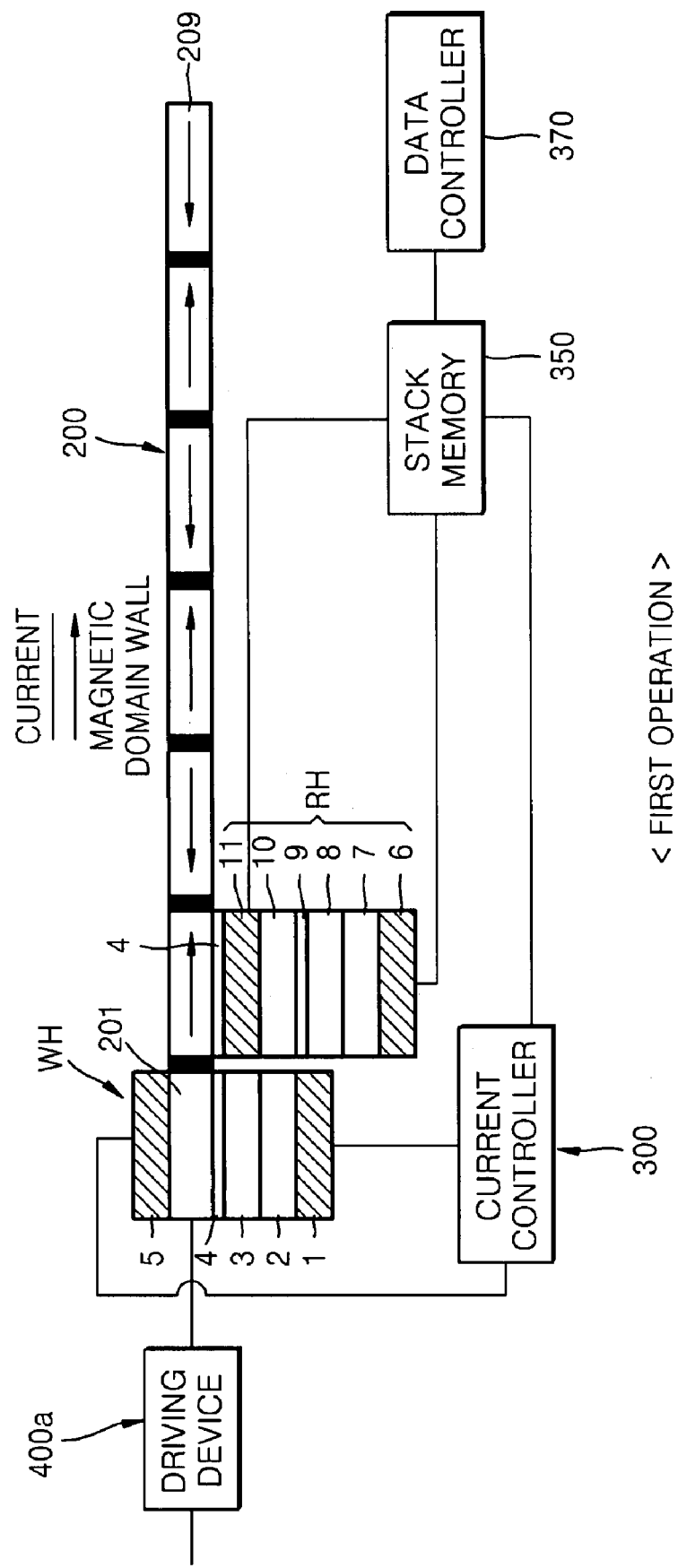
FIGS. 5A and 5B are cross-sectional views for explaining a read operation of the data storage device of FIG. 4, according to another exemplary embodiment of the present invention.
Figure 5B:
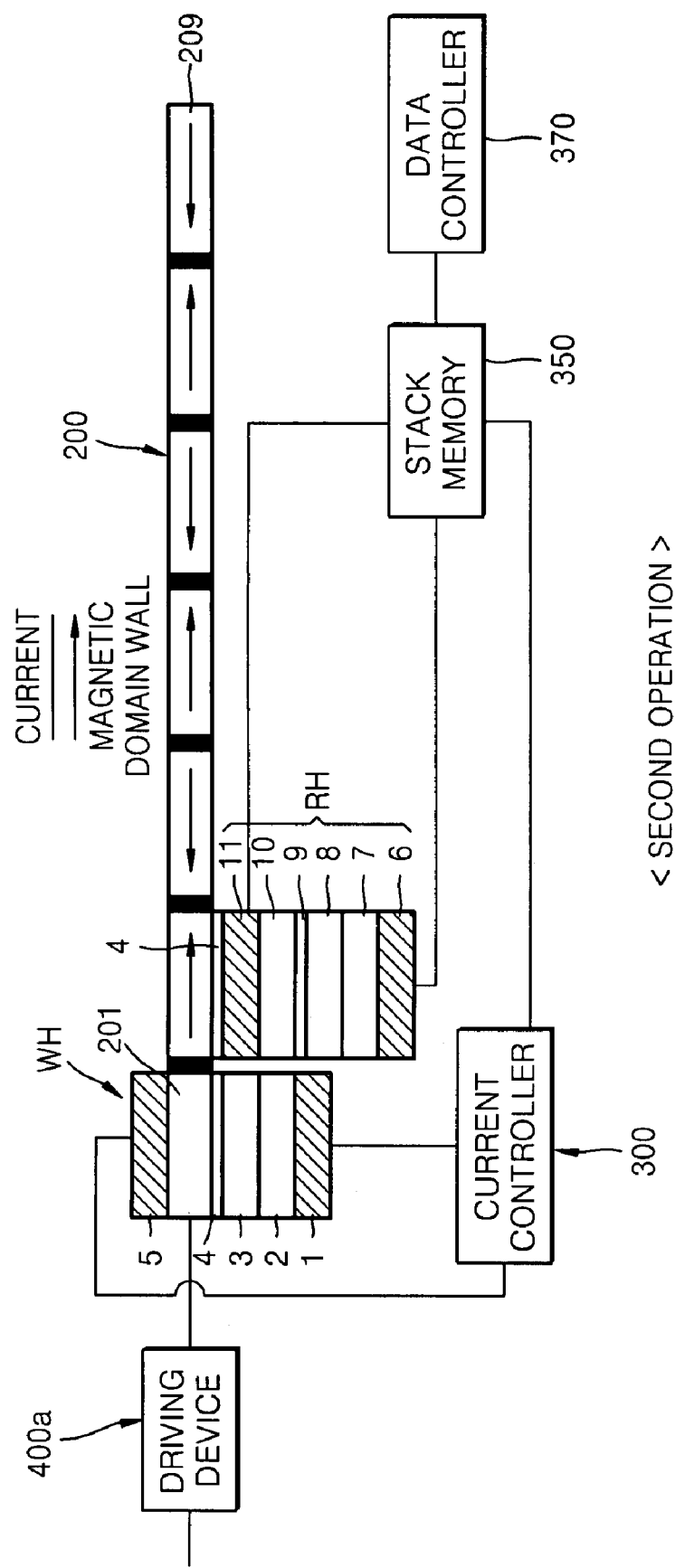

FIGS. 5A and 5B are views for explaining a read operation of the second data storage device. Referring to FIG. 5A, when data has been written to the magnetic layer 200, the data written to the magnetic layer 200 is read using the RH while moving the magnetic domain walls of the magnetic layer 200 toward the end portion 201 by one bit unit using the driving device 400a. The data read from the magnetic layer 200 may be stored in the stack memory 350. FIG. 5A shows a state in which current is applied to move the magnetic domain walls by one bit unit after the data of the portion of the magnetic layer 200 on the RH is read and stored in the stack memory 350.

Referring to FIG. 5B, while the magnetic domain walls of the magnetic layer 200 are moved using the driving device 400a by unit bit toward the other end portion 209, the data stored in the stack memory 350 is written to the magnetic layer 200 using the WH and the current controller 300. The order of output of data stored in the stack memory 350 is opposite to the input order. That is, the data input last needs to be output first. Although the stack memory 350 itself may include an input/output order related function, the data controller 370 connected to the stack memory 350 may include such a function. FIG. 5B shows that the magnetic domain walls are moved by one bit unit after the last bit of data of the stack memory 350 is written to the end portion 201 of the magnetic layer 200. The data written to the magnetic layer 200 returns to the state prior to the beginning of the read operation.

Referring to FIGS. 5A and 5B, it can be seen that the entire area of the magnetic layer 200 except for the end portion 201 of the magnetic layer 200 where the WH is located may be utilized as a data record area. Although FIGS. 5A and 5B illustrate a case where the magnetic layer 200 has a horizontal magnetic anisotropy, the present invention can be identically applied to a case where the magnetic layer 200 has a perpendicular magnetic anisotropy.

Write Operation

Although it is not illustrated, an operation to write new data to the second data storage device includes storing data in the stack memory 350 in a state where a read operation is not performed (operation 1") and writing the data stored in the stack memory 350 to the magnetic layer 200 using the WH and the current controller 300 while moving the magnetic domain walls of the magnetic layer 200 by one bit unit toward the other end portion 209 using the driving device 400a (operation 2"). In operation 1", data is stored in the stack memory 350 using the data controller 370.

In the second data storage device, the entire area of the magnetic layer 200 except for a portion of the magnetic layer 200 where the WH is located, that is, the end portion 201 of the magnetic layer 200, may be utilized as a data record area. That is, an effective storage capacity of the magnetic layer 200 is almost the same as the physical storage capacity. Although the stack memory 350 is additionally needed as a temporary archive of the data read from the magnetic layer 200, since the stack memory 350 is compact and can be commonly connected to a plurality of magnetic layers, the overall recording density of the data storage device is only slightly affected thereby.

As described above, in the data storage device according to an exemplary embodiment of the present invention, the effective storage capacity of the magnetic layer is the same as or substantially the same as the physical storage capacity. In particular, since the data at the other end portion of the magnetic layer is transferred to the end portion in the first data storage device, the read and write operation can be performed while the magnetic domain wall is moved in one direction only without a buffer area. Thus, the present invention may greatly increase the recording density of the data storage device using the magnetic domain wall movement.

Also, while in the conventional technology an operation is needed to restore the magnetic domains to the original position after reading, in the present invention, the operation which consumes power is not needed so that power consumption may be reduced and the data read and write speed may be increased. In addition, since the operation of pushing and pulling the magnetic domain walls is not repeated in the data storage device according to the exemplary embodiments of the present invention, the characteristic of the magnetic layer may be prevented from being deteriorated so that the life span of the device can be increased and reliability of the device is improved.

Furthermore, since the exemplary embodiments of the present invention use a linear type magnetic layer, the manufacturing process may be simplified and high density and large capacity of the device may be made possible. In particular, when the driving device such as the diode is formed on the lowermost layer and the magnetic layers connected to the driving device are formed in a multilayer structure, for example, a multilayer cross point architecture, high density and large capacity of the device can be easily achieved.

In addition, since an exemplary embodiment of the present invention may use a diode as a the driving device for the magnetic domain wall movement, the structure of the device may be simplified and driving of the data storage device is possible with a high current, which is advantageous in the commercialization of the device.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A data storage device using magnetic domain wall movement, the data storage device comprising:
   a magnetic layer having a plurality of magnetic domains;
   a write head provided at an end portion of the magnetic layer;
   a read head to read data written to the magnetic layer; and
   a current controller connected between the write head and the read head, the current controller being configured to transfer information obtained from the read head to the write head.

2. The data storage device of claim 1, wherein the read head is provided at another end portion of the magnetic layer.

3. The data storage device of claim 1, wherein the read head is provided at a portion of the magnetic layer adjacent to the write head.

4. The data storage device of claim 1, wherein the write head is a structure in which a first electrode, an anti-ferromagnetic layer, a ferromagnetic layer, a separation layer, the end portion of the magnetic layer, and a second electrode are sequentially disposed.

5. The data storage device of claim 4, further comprising a separation layer between the magnetic layer and the write head.

6. The data storage device of claim 5, wherein the separation layer is a conductive layer.

7. The data storage device of claim 1, wherein the read head is a structure in which a first electrode, an anti-ferromagnetic layer, a first ferromagnetic layer, a separation layer, a second ferromagnetic layer, and a second electrode are sequentially deposited.

8. The data storage device of claim 1, further comprising:
a separation layer between the magnetic layer and the read head.

9. The data storage device of claim 8, wherein the separation layer is an insulation layer or a conductive layer.

10. The data storage device of claim 8, wherein the separation layer is a conductive layer or an insulation layer and an electric resistance of the conductive layer is 10-100 times greater than that of the magnetic layer.

11. The data storage device of claim 1, further comprising:
a driving device connected to the magnetic layer and which supplies energy which moves a wall between adjacent ones of the plurality of magnetic domains.

12. The data storage device of claim 1, wherein the magnetic layer is a linear magnetic layer.

13. The data storage device of claim 1, wherein a plurality of notches are formed on a surface of the magnetic layer.

14. The data storage device of claim 2, further comprising:
a diode as a driving device that is connected to the magnetic layer and which supplies energy which moves a wall between adjacent ones of the plurality of magnetic domains.

15. The data storage device of claim 3, wherein the write head and the read head are each provided to correspond to respective bit areas that are adjacent to each other.

16. The data storage device of claim 3, further comprising:
a stack memory connected to the read head and the current controller.

17. A method of operating a data storage device, the method comprising:
reading data of an end portion of a magnetic layer using a read head provided at the end portion of the magnetic layer in which a write head is provided at another end portion thereof;
moving magnetic domain walls of the magnetic layer by a distance corresponding to a length of one magnetic domain toward an end portion; and
writing the read data to the other end portion of the magnetic layer using the write head and a current controller connected to the write head and the read head.

18. The method of claim 17, wherein the reading of data of the end portion of the magnetic layer, the moving of magnetic domain walls of the magnetic layer by a distance corresponding to the length of one magnetic domain toward the end portion, and the writing of the read data to the other end portion of the magnetic layer are sequentially repeated.

19. A method of operating a data storage device, the method comprising:
reading data written to a magnetic layer using a read head provided at the magnetic layer by moving magnetic domain walls of the magnetic layer by a distance corresponding to the length of one magnetic domain toward an end portion of the magnetic layer and storing the data read from the magnetic layer in a stack memory connected to the read head; and
writing the data stored in the stack memory to the magnetic layer using a write head provided at the end portion of the magnetic layer and a current controller connected to the write head and the stack memory by moving the magnetic domain walls of the magnetic layer by a distance corresponding to the length of one magnetic domain toward an other end portion of the magnetic layer.

20. The method of claim 19, wherein the read head is provided at a portion of the magnetic layer adjacent to the write head.

21. A data storage device using magnetic domain wall movement, the data storage device comprising:
a magnetic layer having a plurality of magnetic domains;
a write head provided at a first portion of the magnetic layer;
a read head provided at a second portion of the magnetic layer; and
a current controller connected between the write head and the read head, the current controller being configured to transfer information obtained from the read head to the write head.

22. A data storage device using magnetic domain wall movement, the data storage device comprising:
a magnetic layer having a plurality of magnetic domains;
a write head provided at a first end of the magnetic layer;
a read head provided at a second end of the magnetic layer; and
a current controller connected between the write head and the read head, the current controller being configured to transfer information obtained from the read head to the write head; wherein
the magnetic layer is a buffer-free storage layer in which all of the plurality of magnetic domains are used as effective storage domains.

* * * * *